(12) United States Patent
Zou et al.

(10) Patent No.: US 11,063,792 B2
(45) Date of Patent: Jul. 13, 2021

(54) METHOD FOR AUTOMATICALLY ADJUSTING GAIN OF MULTI-STAGE EQUALIZER OF SERIAL DATA RECEIVER

(71) Applicant: AMLOGIC (SHANGHAI) CO., LTD., Shanghai (CN)

(72) Inventors: Weihua Zou, Shanghai (CN); Ming Shi, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/729,430

(22) Filed: Dec. 29, 2019

(65) Prior Publication Data
US 2020/0274742 A1 Aug. 27, 2020

(30) Foreign Application Priority Data
Dec. 29, 2018 (CN) .......................... 201811642608.9

(51) Int. Cl.
*H04L 25/03* (2006.01)
(52) U.S. Cl.
CPC .............................. *H04L 25/03885* (2013.01)
(58) Field of Classification Search
CPC ...... H03H 21/0012; H04L 2025/03363; H04L 25/03885; H04L 27/08
See application file for complete search history.

(56) References Cited

U.S. PATENT DOCUMENTS

| | | | | |
|---|---|---|---|---|
| 4,458,362 A * | 7/1984 | Berkovitz | .............. | H03G 5/005 333/28 T |
| 5,793,723 A * | 8/1998 | Okuyama | .............. | G11B 7/005 369/116 |
| 6,304,615 B1 * | 10/2001 | Webster | ............ | H04L 25/03878 375/319 |
| 6,532,364 B1 * | 3/2003 | Uchida | ................ | H04B 7/2618 370/332 |
| 7,564,899 B2 * | 7/2009 | Kuijk | ..................... | H04B 3/141 375/229 |

(Continued)

FOREIGN PATENT DOCUMENTS

| CN | 101238691 B | 9/2012 |
|---|---|---|
| CN | 103095618 B | 10/2017 |

*Primary Examiner* — Berhanu Tadese
(74) *Attorney, Agent, or Firm* — Richard T. Black; Foster Garvey PC

(57) ABSTRACT

The invention provides a method for automatically adjusting the gain of a multi-stage equalizer of a serial data receiver, the serial data receiver provides a gain circuit, the gain circuit comprises a multi-stage equalization circuit, and each stage of equalization circuit is arranged in series; the method comprises: Step S1, setting corresponding serial numbers for each stage of equalization circuit in sequence; Step S2, selecting an equalization circuit corresponding to the serial number from the gain circuit according to a preset rule; Step S3, sequentially adjusting the selected equalization circuits of each stage according to the sequence of the serial numbers to obtain corresponding standard adjustment values; and Step S4, adjusting the equalization circuit greater than or equal to the corresponding serial number according to the standard adjustment value. The method has the benefits that the optimal compensation for the signal is realized.

8 Claims, 6 Drawing Sheets

(56) References Cited

U.S. PATENT DOCUMENTS

| | | | | |
|---|---|---|---|---|
| 7,633,354 B2* | 12/2009 | Kuijk | H04L 25/03878 | 333/28 R |
| 7,707,301 B2* | 4/2010 | Deng | H04N 21/23103 | 709/231 |
| 7,969,648 B2* | 6/2011 | Inagaki | H01S 3/06758 | 359/337.1 |
| 8,351,493 B2* | 1/2013 | Shakiba | H03H 21/0012 | 375/229 |
| 8,396,168 B2* | 3/2013 | Khayrallah | H04L 27/38 | 375/324 |
| 8,565,296 B2* | 10/2013 | Shinmyo | H04L 27/01 | 375/232 |
| 8,755,427 B2* | 6/2014 | Shakiba | H04L 27/08 | 375/232 |
| 9,002,021 B2* | 4/2015 | Takeuchi | H03G 9/005 | 381/57 |
| 9,184,957 B2* | 11/2015 | Chang | H04L 25/03019 | |
| 9,614,564 B2* | 4/2017 | Chang | H04L 27/01 | |
| 9,614,697 B2* | 4/2017 | Chang | H04L 27/01 | |
| 9,780,979 B2* | 10/2017 | Sun | H04L 25/03273 | |
| 10,057,674 B1* | 8/2018 | Tseng | H04R 1/1041 | |
| 10,069,653 B1* | 9/2018 | Derras | H04L 25/0305 | |
| 10,536,178 B2* | 1/2020 | Chang | H04B 1/16 | |
| 2002/0196844 A1* | 12/2002 | Rafie | H04L 25/03038 | 375/232 |
| 2003/0043897 A1* | 3/2003 | Papanikolaou | H04L 25/03885 | 375/229 |
| 2003/0053534 A1* | 3/2003 | Sivadas | H04L 25/03885 | 375/229 |
| 2003/0198299 A1* | 10/2003 | Redfern | H04L 27/2605 | 375/260 |
| 2004/0061929 A1* | 4/2004 | Lelic | H01S 3/06754 | 359/341.1 |
| 2005/0286626 A1* | 12/2005 | Chou | H04L 25/03019 | 375/232 |
| 2006/0126715 A1* | 6/2006 | Lai | H03G 3/3052 | 375/233 |
| 2006/0182171 A1* | 8/2006 | Kuijk | H04B 3/141 | 375/229 |
| 2007/0014344 A1* | 1/2007 | Maangat | H04L 25/03885 | 375/229 |
| 2007/0166037 A1* | 7/2007 | Palacharla | H04J 14/0298 | 398/72 |
| 2007/0230640 A1* | 10/2007 | Bryan | H04L 25/03057 | 375/349 |
| 2008/0056344 A1* | 3/2008 | Hidaka | H04L 25/063 | 375/232 |
| 2008/0074731 A1* | 3/2008 | Takeyama | H01S 3/06758 | 359/333 |
| 2008/0253011 A1* | 10/2008 | Mouri | H03L 7/093 | 360/39 |
| 2009/0128239 A1* | 5/2009 | Kuijk | H04L 25/03878 | 330/254 |
| 2010/0124265 A1* | 5/2010 | Shakiba | H03H 21/0012 | 375/232 |
| 2010/0194478 A1* | 8/2010 | Maillard | H03F 3/45183 | 330/254 |
| 2011/0122912 A1* | 5/2011 | Benjamin | H01S 5/4006 | 372/50.124 |
| 2011/0134335 A1* | 6/2011 | Laurent-Michel | H04N 5/455 | 348/731 |
| 2011/0255638 A1* | 10/2011 | Khayrallah | H04L 27/38 | 375/316 |
| 2012/0051466 A1* | 3/2012 | Wang | H04L 25/08 | 375/340 |
| 2012/0063771 A1* | 3/2012 | Sugaya | H04B 10/294 | 398/26 |
| 2013/0121395 A1* | 5/2013 | Shakiba | H04L 27/08 | 375/232 |
| 2013/0148704 A1* | 6/2013 | Shinmyo | H04L 25/03019 | 375/219 |
| 2013/0278338 A1* | 10/2013 | Temporiti Milani | H03F 3/45076 | 330/259 |
| 2014/0119422 A1* | 5/2014 | Chang | H04B 3/14 | 375/229 |
| 2014/0185661 A1* | 7/2014 | Chang | H04L 25/03019 | 375/232 |
| 2015/0256525 A1* | 9/2015 | Takaoka | H04L 63/0853 | 726/7 |
| 2016/0028560 A1* | 1/2016 | Chang | H03F 3/4521 | 375/232 |
| 2016/0043842 A1* | 2/2016 | Gong | H04L 5/0035 | 370/329 |
| 2016/0073180 A1* | 3/2016 | Khotimsky | H04J 3/0682 | 398/34 |
| 2016/0080177 A1* | 3/2016 | Pan | H04L 25/03885 | 375/233 |
| 2016/0308566 A1* | 10/2016 | Chang | H04L 7/0087 | |
| 2017/0085294 A1* | 3/2017 | Levacov | H04B 7/0413 | |
| 2017/0207805 A1* | 7/2017 | Chang | H04B 3/16 | |
| 2017/0222848 A1* | 8/2017 | Sun | H04L 7/0012 | |
| 2017/0279527 A1* | 9/2017 | Kim | H04B 10/272 | |
| 2017/0359205 A1* | 12/2017 | Berke | H04L 25/061 | |
| 2019/0165826 A1* | 5/2019 | Goto | H04L 1/0003 | |
| 2019/0306622 A1* | 10/2019 | Yan | H03G 5/025 | |
| 2020/0202816 A1* | 6/2020 | Kim | G09G 3/3611 | |
| 2020/0244491 A1* | 7/2020 | Zhou | H04L 25/03178 | |
| 2020/0244492 A1* | 7/2020 | Zhou | H04L 25/03878 | |
| 2020/0252248 A1* | 8/2020 | Palusa | H04L 25/03878 | |
| 2020/0274742 A1* | 8/2020 | Zou | H04L 25/03885 | |

* cited by examiner

METHOD FOR AUTOMATICALLY ADJUSTING GAIN OF MULTI-STAGE EQUALIZER OF SERIAL DATA RECEIVER

CROSS-REFERENCE TO RELATED APPLICATIONS

The present application claims priority to and the benefit of Chinese Patent Application No. CN 201811642608.9 filed on Dec. 29, 2018, the entire content of which is incorporated herein by reference.

BACKGROUND OF THE INVENTION

Field of the Invention

The invention relates to the technical field of high-speed serial data receiver, and more particularly, to a method for automatically adjusting a gain of a multi-stage equalizer of a serial data receiver.

Description of the Related Art

The development of science and technology, along with the social progress, allows people to have higher requirements for a high-speed data transmission and a more accurate data transmission. And since serial data is one of the most commonly used methods for transmission of high-speed signals, the design of the serial data receiver becomes ever more important.

Since signals are located in a complex and changeable environment, the signals may be easily attenuated. An equalizer may be provided in the serial data receiver to gain the attenuated signals, so that the effective compensation for the attenuated signals is realized. The optimal compensation for the attenuated signals may not be realized simply by using the existing equalizer due the limitations of various technologies, so that the performance of the serial data receiver system is greatly reduced. Therefore, the proper way to adjust the gain of the equalizer is of great importance.

SUMMARY OF THE INVENTION

Given that the foregoing problems exist in the prior art, the present invention provides a method for automatically adjusting a gain of a multi-stage equalizer of a serial data receiver. According to the method, the gain of each stage of equalizer is gradually adjusted for the multi-stage equalizer by setting the standard adjustment value, so that the optimal compensation for the signal is realized, and the adjustment performance of the serial data receiver is further improved.

The technical solution is as follows:

A method for automatically adjusting a gain of a multi-stage equalizer of a serial data receiver, applied to the serial data receiver, wherein, the serial data receiver provides a gain circuit, the gain circuit comprises a multi-stage equalization circuit, and each stage of the equalization circuit is arranged in series;

the automatic adjusting method comprises:

Step S1, setting corresponding serial numbers for each stage of the equalization circuit in sequence;

Step S2, selecting an equalization circuit corresponding to the serial number from the gain circuit according to a preset rule;

Step S3, sequentially adjusting the selected equalization circuit of each stage according to the sequence of the serial numbers to obtain corresponding standard adjustment values; and Step S4, adjusting the equalization circuit greater than or equal to the corresponding serial number according to the standard adjustment values.

Preferably, in the above-mentioned automatic adjusting method, wherein the preset rule in Step S2 is to select the equalization circuit corresponding to the serial number at a preset interval.

Preferably, in the above-mentioned automatic adjusting method, wherein the preset interval is more than one of the equalization circuits.

Preferably, in the above-mentioned automatic adjusting method, wherein the preset rule in Step S2 comprises:

Step C1, counting the number of the equalization circuits;

Step C2, calculating the serial number of the selected equalization circuit using the following formula according to the number;

$$\begin{cases} A = 1, m = 1 \\ A = \dfrac{2^{m-1} - 1}{2^m - 1} \times n, m \geq 2 \end{cases}$$

wherein A represents the serial number of the selected equalization circuit, when A is not an integer, A is set to an integer closest to A and greater than A;

m represents a current round of selection; and n represents the number of the equalization circuits.

Preferably, in the above-mentioned automatic adjusting method, wherein the equalization circuit is provided with a standard gain value;

Step S3 further comprises:

Step S31, comparing a gain value of the current equalization circuit with the standard gain value;

if the gain value of the current equalization circuit is equal to the standard gain value, executing Step S32;

if the gain value of current the equalization circuit is not equal to the standard gain value, executing Step S33;

Step S32, setting the gain value of the current equalization circuit to the standard gain value, and executing Step S4; and Step S33, adjusting the gain value of the current equalization circuit until the gain value of the current equalization circuit is set to the standard gain value, then executing Step S4.

Preferably, in the above-mentioned automatic adjusting method, wherein the equalization circuit comprises two branch circuits, one end of each of the two branch circuits is connected to VDD, and the other end of each of the two branch circuits is connected to GND;

a NMOS transistor is arranged on each of the two branch circuits;

a resistor is connected between a drain of the NMOS transistor of each of the two branch circuits and VDD;

an output point is arranged between the resistor of each of the two branch circuits and the drain of the NMOS transistor, and a branch capacitor is connected between the output point and GND;

a current source is connected between a source of the NMOS transistor of each of the two branch circuits and GND;

a first access point is arranged between the source of the NMOS transistor of each of the two branch circuits and the current source, and an adjusting resistor is connected between the two first access points;

a second access point is arranged between the first access point of each of the two branch circuits and the current source, and an adjusting capacitor is connected between the two second access points; and/or the equalization circuit is provided with a transfer function expressed by the following formula:

$$H(s) = \frac{g_m}{C_p} \frac{s + \frac{1}{R_s C_s}}{\left(s + \frac{1 + g_m R_s/2}{R_s C_s}\right)\left(s + \frac{1}{R_D C_p}\right)}$$

wherein $g_m$ represents transconductance;
s represents variables of the transfer function;
$R_D$ represents resistance;
$C_p$ represents capacitances of the two branch circuits;
$R_s$ represents an adjusting resistance;
$C_s$ represents an adjusting capacitance.

Preferably, in the above-mentioned automatic adjusting method, wherein the gain value of the current equalization circuit is calculated based on the transfer function according to the following formula;

$$\text{Ideal Peaking} = \frac{\text{Ideal peak gain}}{\text{DC gain}} = 1 + g_m R_s/2;$$

wherein Ideal Peaking represents the gain value;
Ideal peak gain represents a maximum gain value; and
DC gain represents a DC gain value.

Preferably, in the above-mentioned automatic adjusting method, wherein the standard gain value comprises a standard capacitance adjustment value and a standard resistance adjustment value;

Step S33 further comprises:

Step S331, determining whether the gain value of the current equalization circuit is less than the standard gain value;

if yes, executing Step S332;

if no, executing Step S335;

Step S332, determining whether a capacitance value corresponding to the current equalization circuit is close to a preset capacitance maximum value;

if yes, increasing a resistance value corresponding to the current equalization circuit by a preset resistance added value, setting the capacitance value corresponding to the current equalization circuit to 0.5 times the preset capacitance maximum value, and executing Step S333;

if no, increasing the capacitance value corresponding to the current equalization circuit by a preset capacitance added value, and executing Step S333;

Step S333, determining whether the capacitance value corresponding to the current equalization circuit is close to the preset capacitance maximum value;

if yes, setting the capacitance value and the resistance value corresponding to the current equalization circuit to the standard capacitance adjustment value and the standard resistance adjustment value, and executing Step S4;

if no, increasing the number of cycle once, and returning to Step S332 until the number of cycle is equal to a preset number of cycle threshold value, and executing Step S334;

Step S334, determining whether the capacitance value corresponding to the current equalization circuit is close to the preset capacitance maximum value;

if yes, setting the capacitance value and the resistance value corresponding to the current equalization circuit to the standard capacitance adjustment value and the standard resistance adjustment value, and executing Step S4;

if no, returning to Step S331;

Step S335, determining whether the capacitance value corresponding to the current equalization circuit is close to a preset capacitance minimum value;

if yes, decreasing a resistance value corresponding to the current equalization circuit by a preset resistance added value, setting the capacitance value corresponding to the current equalization circuit to 0.5 times the preset capacitance maximum value;

if no, decreasing the capacitance value corresponding to the current equalization circuit by the preset capacitance added value;

Step S336, determining whether the capacitance value corresponding to the current equalization circuit is close to the preset capacitance minimum value;

if yes, setting the capacitance value and the resistance value corresponding to the current equalization circuit to the standard capacitance adjustment value and the standard resistance adjustment value, and executing Step S4;

if no, increasing the number of cycle once, and returning to Step S335 until the number of cycle is equal to a preset number of cycle threshold value, and executing Step S337;

Step S337, determining whether the capacitance value corresponding to the current equalization circuit is close to the preset capacitance minimum value;

if yes, setting the capacitance value and the resistance value corresponding to the current equalization circuit to the standard capacitance adjustment value and the standard resistance adjustment value, and executing Step S4;

if no, returning to Step S331.

Preferably, in the above-mentioned automatic adjusting method, wherein the preset capacitance added value is set according to user requirements, and/or the preset resistance added value is set according to user requirements.

By adopting the above-mentioned technical solutions, the present invention has the beneficial effects that the gain of each stage of equalizer is gradually adjusted for the multi-stage equalizer by setting the standard adjustment value, so that the optimal compensation for the signal is realized, and the adjustment performance of the serial data receiver is further improved.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
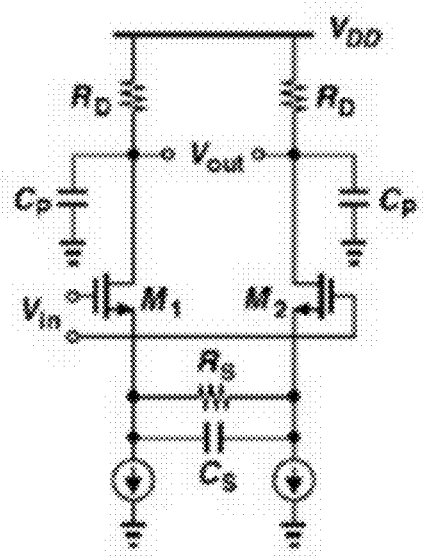
FIG. 1 is a first-stage equalization circuit diagram of an embodiment of a method for automatically adjusting a gain of a multi-stage equalizer of a serial data receiver according to the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Figure 3:
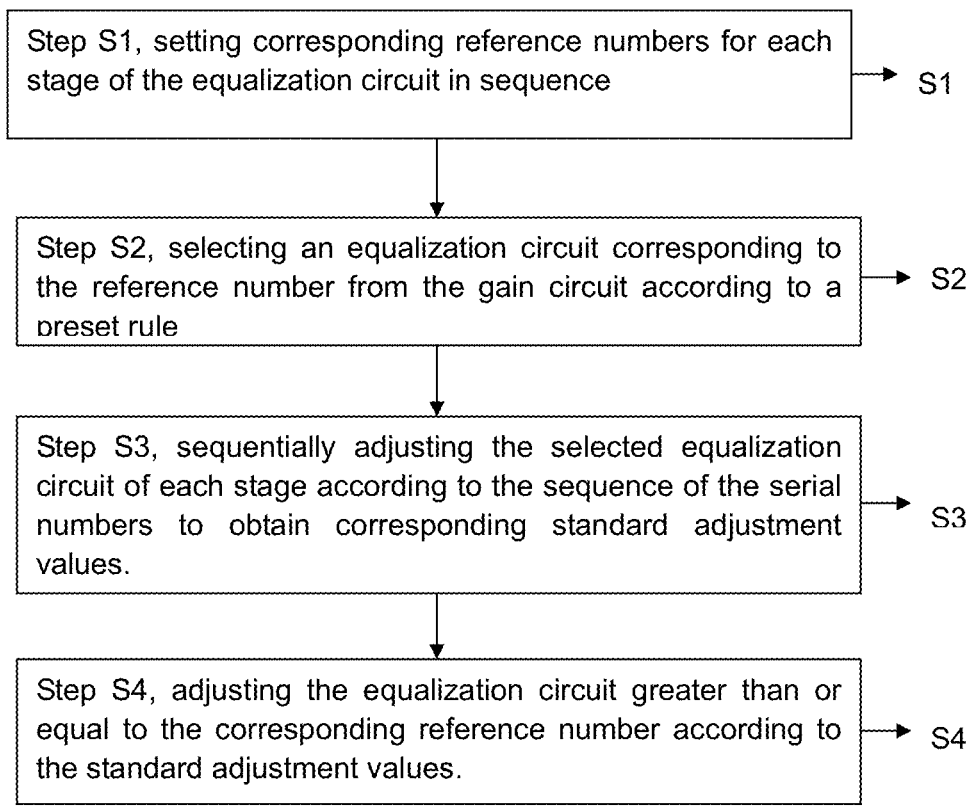
FIG. 3 is a flowchart of an embodiment of a method for automatically adjusting a gain of a multi-stage equalizer of a serial data receiver according to the present invention.

The present invention comprises a method for automatically adjusting a gain of a multi-stage equalizer of a serial data receiver, applied to the serial data receiver, wherein, the serial data receiver provides a gain circuit, the gain circuit comprises a multi-stage equalization circuit, and each stage of the equalization circuit is arranged in series;

as shown in FIG. 3, the automatic adjusting method comprises:

Step S1, setting corresponding serial numbers for each stage of the equalization circuit in sequence;

Step S2, selecting an equalization circuit corresponding to the serial number from the gain circuit according to a preset rule;

Step S3, sequentially adjusting the selected equalization circuit of each stage according to the sequence of the serial numbers to obtain corresponding standard adjustment values; and Step S4, adjusting the equalization circuit greater than or equal to the corresponding serial number according to the standard adjustment values.

In the above-mentioned embodiment, setting corresponding serial numbers for each stage of the equalization circuit, selecting an equalization circuit corresponding to the serial number, so that adjustments may be made depending on actual needs, that is, sequentially adjusting the selected equalization circuit of each stage according to the sequence of the serial numbers to obtain corresponding standard adjustment values, and finally, adjusting the multi-stage equalizer the equalization circuit greater than or equal to the corresponding serial number according to the standard adjustment values. In this way, the gain of each stage of equalizer is gradually adjusted for the multi-stage equalizer, so that the optimal compensation for the signal is realized, and the adjustment performance of the serial data receiver is further improved.

The above-mentioned embodiment is applicable in a chip of TSMC 28 nm 12 nm, and the gain of each stage of equalizer is gradually adjusted for the multi-stage equalizer, so that the optimal compensation for the signal is realized, and the adjustment performance of the serial data receiver is further improved.

Furthermore, as preferred embodiment, the preset rule in Step S2 is to select the equalization circuit corresponding to the serial number at a preset interval.

Setting corresponding serial numbers for each stage of the multi-stage equalization circuit (in this embodiment, the serial number is 1–n), and selecting all the equalization circuits.

In the first stage, an equalization circuit with a serial number 1 is adjusted to obtain a standard adjustment value with a serial number 1, and the equalization circuit with a serial number 1–n is adjusted according to the standard adjustment value with the serial number 1;

in the second stage, an equalization circuit with a serial number 2 is adjusted to obtain a standard adjustment value with a serial number 2, and the equalization circuit with a serial number 2–n is adjusted according to the standard adjustment value with the serial number 2;

in the third stage, an equalization circuit with a serial number 3 is adjusted to obtain a standard adjustment value with a serial number 3, and the equalization circuit with a serial number 3–n is adjusted according to the standard adjustment value with the serial number 3;

and so on;

in the $n^{th}$ stage, an equalization circuit with a serial number n is adjusted to obtain a standard adjustment value with a serial number n, and the equalization circuit with a serial number n is adjusted according to the standard adjustment value with the serial number n.

In the above-mentioned embodiment, the gain of each stage of equalizer is gradually adjusted, so that the optimal compensation for the signal is realized, and the adjustment performance of the serial data receiver is further improved.

Furthermore, as a preferred embodiment, the preset interval is more than one of the equalization circuits.

For example when the user defines that the preset interval is one equalization circuit, setting corresponding serial numbers for each stage of the equalization circuit of the multi-stage equalization circuit (in this embodiment, the serial number is 1–n), and selecting an equalization circuit with a corresponding serial number every two equalization circuits (here, the corresponding serial number is 1,3,5, . . . ).

In the first stage, an equalization circuit with a serial number 1 is adjusted to obtain a standard adjustment value with a serial number 1, and the equalization circuit with a serial number 1–n is adjusted according to the standard adjustment value with the serial number 1;

in the second stage, an equalization circuit with a serial number 3 is adjusted to obtain a standard adjustment value with a serial number 3, and the equalization circuit with a serial number 3–n is adjusted according to the standard adjustment value with the serial number 3;

in the third stage, an equalization circuit with a serial number 5 is adjusted to obtain a standard adjustment value with a serial number 5, and the equalization circuit with a serial number 5–n is adjusted according to the standard adjustment value with the serial number 5;

and so on;

in the $n^{th}$ stage (when n is an odd number), an equalization circuit with a serial number n is adjusted to obtain a standard adjustment value with a serial number n, and the equalization circuit with a serial number n is adjusted according to the standard adjustment value with the serial number n; or in the $n^{th}$ stage (when n is an even number), an equalization circuit with a serial number n–1 is adjusted to obtain a standard adjustment value with a serial number n–1, and the equalization circuits with a serial number n–1 and with a serial number n are adjusted according to the standard adjustment value with the serial number n–1.

For example, when the user defines that the preset interval is two equalization circuits, setting corresponding serial numbers for each stage of the equalization circuit of the multi-stage equalization circuit (in this embodiment, the serial number is 1–n), and selecting an equalization circuit with a corresponding serial number every two equalization circuits (here, the corresponding serial number is 1,4,7, . . . ).

In the first stage, an equalization circuit with a serial number 1 is adjusted to obtain a standard adjustment value with a serial number 1, and the equalization circuit with a serial number 1–n is adjusted according to the standard adjustment value with the serial number 1;

in the second stage, an equalization circuit with a serial number 4 is adjusted to obtain a standard adjustment value with a serial number 4 and the equalization circuit with a serial number 4–n is adjusted according to the standard adjustment value with the serial number 4;

in the third stage, an equalization circuit with a serial number 7 is adjusted to obtain a standard adjustment value with a serial number 7, and the equalization circuit with a serial number 7–n is adjusted according to the standard adjustment value with the serial number 7;

and so on;

in the $n^{th}$ stage (when n is a multiple of 3), an equalization circuit with a serial number n–2 is adjusted to obtain a standard adjustment value with a serial number n–2, and the equalization circuits with a serial number n–2, a serial number n–1, and a serial number n are adjusted according to the standard adjustment value with the serial number n–2; or in the $n^{th}$ stage (when n is a multiple of 3 minus 1), an equalization circuit with a serial number n–1 is adjusted to obtain a standard adjustment value with a serial number n–1, and the equalization circuits with a serial number n–1 and a serial number n are adjusted according to the standard adjustment value with the serial number n–1; or in the $n^{th}$ stage (when n is a multiple of 3 plus 1), an equalization circuit with a serial number n is adjusted to obtain a standard adjustment value with a serial number n, and the equalization circuit with a serial number n are adjusted according to the standard adjustment value with the serial number n.

in the above-mentioned embodiment, the gain of each stage of equalizer is gradually adjusted, so that the optimal compensation for the signal is realized, and the adjustment performance of the serial data receiver is further improved.

Figure 4:
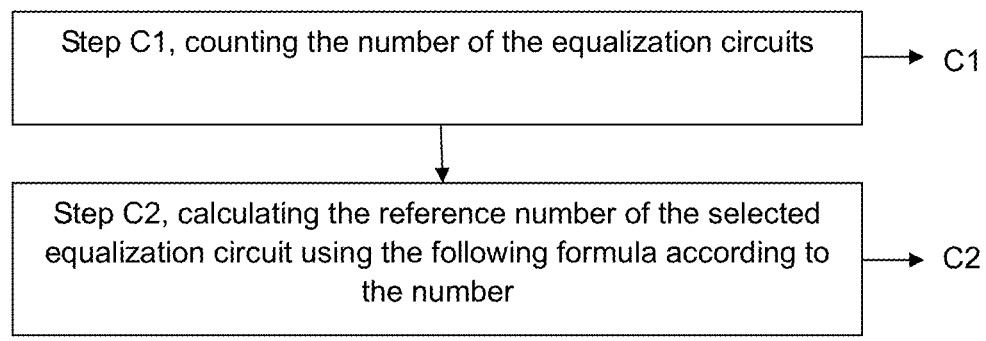
FIG. 4 is a flowchart of a preset rule of an embodiment of a method for automatically adjusting a gain of a multi-stage equalizer of a serial data receiver according to the present invention.

Furthermore, as a preferred embodiment, as shown in FIG. 4, the preset rule in Step S2 comprises:

Step C1, counting the number of the equalization circuit;

Step C2, calculating the serial number of the selected equalization circuit using the following formula according to the number;

$$\begin{cases} A = 1, m = 1 \\ A = \dfrac{2^{m-1} - 1}{2^m - 1} \times n, m \geq 2 \end{cases} \quad (1)$$

wherein A represents the serial number of the selected equalization circuit, when A is not an integer, A is set to an integer closest to A and greater than A;

m represents a current round of selection; and n represents the number of the equalization circuits.

setting corresponding serial numbers for each stage of the equalization circuit of the multi-stage equalization circuit (in this embodiment, the serial number is 1–n), and selecting an equalization circuit with a corresponding serial number based on the dichotomy.

When n is 12;

in the first stage, an equalization circuit with a serial number 1 is adjusted to obtain a standard adjustment value with a serial number 1, and the equalization circuits with serial number 1-12 are adjusted according to the standard adjustment value with the serial number 1;

in the second stage, an equalization circuit with a serial number 6 is adjusted to obtain a standard adjustment value with a serial number 6, and the equalization circuits with serial number 6-12 are adjusted according to the standard adjustment value with the serial number 6;

in the third stage, A is calculated to be equal to 10.5. Since A is not an integer, A is set to an integer closest to A and greater than A, that is A is set to 11;

an equalization circuit with a serial number 11 is adjusted to obtain a standard adjustment value with a serial number 10, then the equalization circuits with serial numbers 11 and 12 are adjusted according to the standard adjustment value with the serial number 10;

in the fourth stage, A is calculated to be equal to 11.25. Since A is not an integer, A is set to an integer closest to A and greater than A, that is A is set to 12;

an equalization circuit with a serial number 12 is adjusted to obtain a standard adjustment value with a serial number 12, then the equalization circuit with a serial number 12 is adjusted according to the standard adjustment value with the serial number 12.

When n is 7;

in the first stage, an equalization circuit with a serial number 1 is adjusted to obtain a standard adjustment value with a serial number 1, and the equalization circuit with a serial number 1-7 is adjusted according to the standard adjustment value with the serial number 1;

in the second stage, A is calculated to be equal to 3.5. Since A is not an integer, A is set to an integer closest to A and greater than A, that is A is set to 4;

an equalization circuit with a serial number 4 is adjusted to obtain a standard adjustment value with a serial number 4, and the equalization circuit with a serial number 4-7 is adjusted according to the standard adjustment value with the serial number 4;

in the third stage, A is calculated to be equal to 5.25. Since A is not an integer, A is set to an integer closest to A and greater than A, that is A is set to 6;

an equalization circuit with a serial number 6 is adjusted to obtain a standard adjustment value with a serial number 6, and the equalization circuits with serial numbers 6 and 7 are adjusted according to the standard adjustment value with the serial number 6;

in the fourth stage, A is calculated to be equal to 6.125. Since A is not an integer, A is set to an integer closest to A and greater than A, that is A is set to 7;

an equalization circuit with a serial number 7 is adjusted to obtain a standard adjustment value with a serial number 7, and the equalization circuits with the serial number 7 are adjusted according to the standard adjustment value with the serial number 7.

in the above-mentioned embodiment, the gain of each stage of equalizer is gradually adjusted, so that the optimal compensation for the signal is realized, and the adjustment performance of the serial data receiver is further improved.

Figure 5:
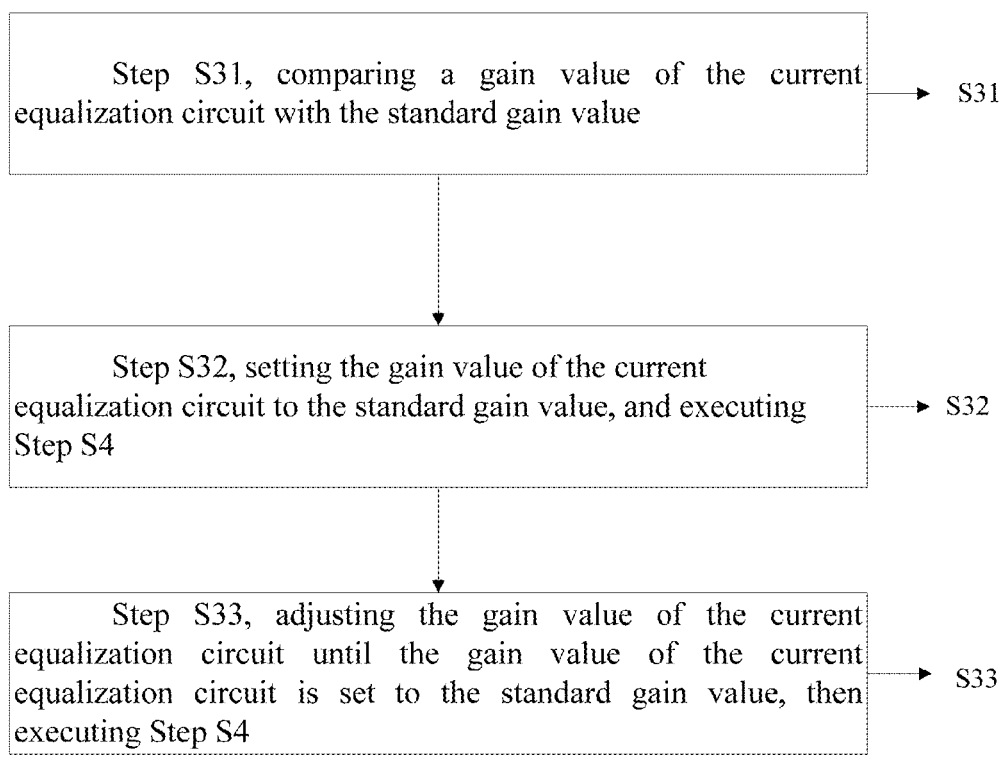
FIG. 5 is a flowchart of Step S3 of an embodiment of a method for automatically adjusting a gain of a multi-stage equalizer of a serial data receiver according to the present invention.

Furthermore, as a preferred embodiment, the equalization circuit is provided with a standard gain value;

as shown in FIG. 5, Step S3 further comprises:

Step S31, comparing a gain value of the current equalization circuit with the standard gain value;

if the gain value of the current equalization circuit is equal to the standard gain value, executing Step S32;

if the gain value of current the equalization circuit is not equal to the standard gain value, executing Step S33;

Step S32, setting the gain value of the current equalization circuit to the standard gain value, and executing Step S4; and Step S33, adjusting the gain value of the current equalization circuit until the gain value of the current equalization circuit is set to the standard gain value, then executing Step S4.

Furthermore, as a preferred embodiment, a circuit diagram of each stage of the equalization circuit is shown in FIG. 1;

the equalization circuit comprises two branch circuits, one end of each of the two branch circuits is connected to VDD, and the other end of each of the two branch circuits is connected to GND;

a NMOS transistor is arranged on each of the two branch circuits;

a resistor is connected between a drain of the NMOS transistor of each of the two branch circuits and VDD;

an output point is arranged between the resistor of each of the two branch circuits and the drain of the NMOS transistor, and a branch capacitor is connected between the output point and GND;

a current source is connected between a source of the NMOS transistor of each of the two branch circuits and GND;

a first access point is arranged between the source of the NMOS transistor of each of the two branch circuits and the current source, and an adjusting resistor is connected between the two first access points;

a second access point is arranged between the first access point of each of the two branch circuits and the current source, and an adjusting capacitor is connected between the two second access points; and/or the equalization circuit is provided with a transfer function expressed by the following formula:

$$H(s) = \frac{g_m}{C_p} \frac{s + \frac{1}{R_s C_s}}{\left(s + \frac{1 + g_m R_s/2}{R_s C_s}\right)\left(s + \frac{1}{R_D C_p}\right)} \quad (2)$$

wherein $g_m$ represents transconductance;

s represents variables of the transfer function;

$R_D$ represents resistance;

$C_p$ represents capacitances of the two branch circuits;

$R_s$ represents an adjusting resistance;

$C_s$ represents an adjusting capacitance.

$$\omega_z = \frac{1}{R_s C_s}; \quad (3)$$

$$\omega_{p1} = \frac{1 + g_m R_s/2}{R_s C_s}; \quad (4)$$

$$\omega_{p2} = \frac{1}{R_D C_p}; \quad (5)$$

$$\text{Ideal peak gain} = g_m R_D; \quad (6)$$

$$DC \text{ gain} = \frac{g_m R_D}{1 + g_m R_s/2}; \quad (7)$$

the gain value of the current equalization circuit is calculated based on the formulas (2)-(7) according to the following formula;

$$\text{Ideal Peaking} = \frac{\text{Ideal peak gain}}{DC \text{ gain}} = 1 + g_m R_s/2; \quad (8)$$

wherein Ideal Peaking represents the gain value;

Ideal peak gain represents a maximum gain value; and

DC gain represents a DC gain value.

Figure 2:
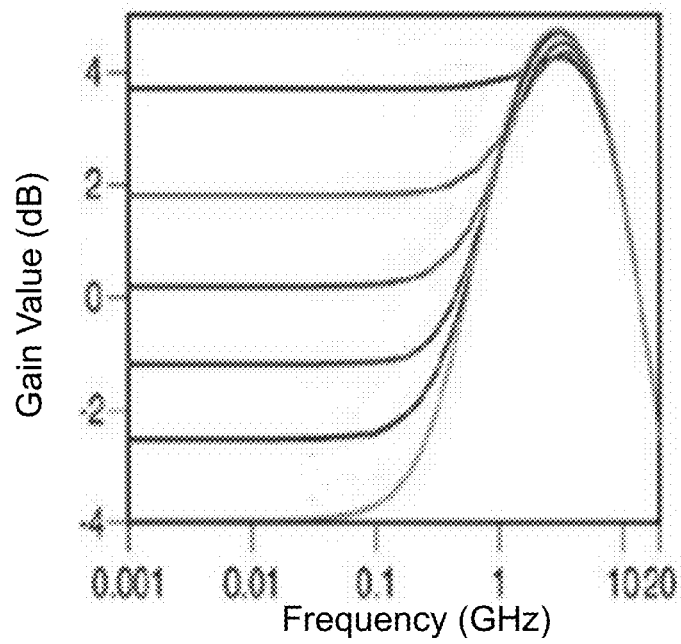
FIG. 2 is a graph showing a relationship between a frequency and a gain value of an embodiment of a method for automatically adjusting a gain of a multi-stage equalizer of a serial data receiver according to the present invention.

Through the above formula (8), graphs of different frequencies and gains corresponding to Cs and Rs are obtained, as shown in FIG. 2; wherein the Cs and Rs corresponding to the bottom curve are smaller than the Cs and Rs corresponding to the remaining curves, and the Cs and Rs corresponding to the upmost curve are larger than the Cs and Rs corresponding to the remaining curves.

It can be seen from the figure that the equalizer can modulate the gain by adjusting the Cs and Rs. In a high-speed serial data transmission system, the number of stages of the equalizer is generally multi-stage, and there will be Cs1 Cs2 . . . Csn, Rs1 Rs2 . . . Rsn. By adopting the above-mentioned method, the gain of each stage of Cs and Rs is gradually adjusted to obtain optimum parameters Cs1 Cs2 . . . Csn, Rs1 Rs2 . . . Rsn, and the optimum gain may be used to compensate the attenuation of the serial data signal.

Figure 6:
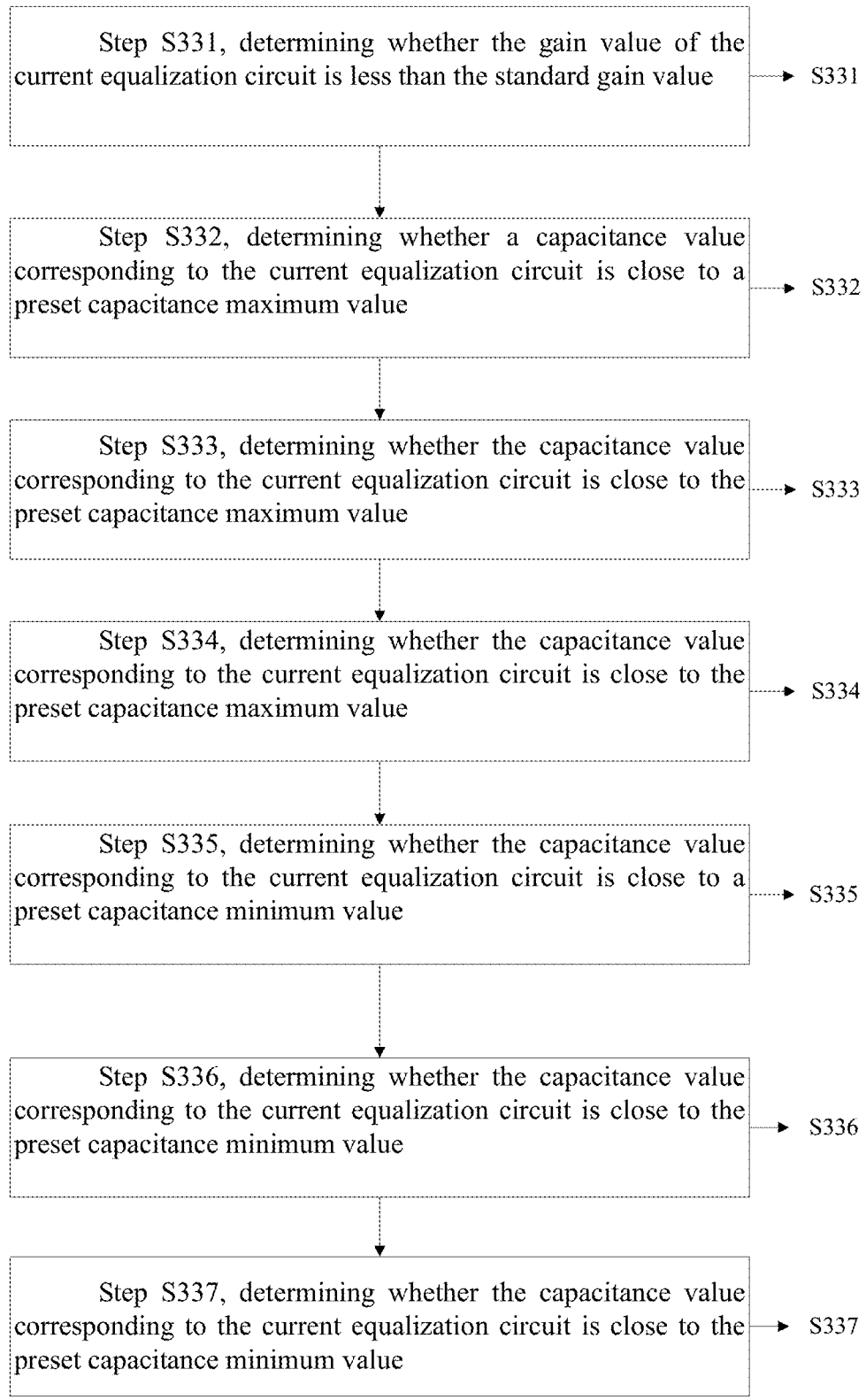
FIG. 6 is a flowchart of Step S33 of an embodiment of a method for automatically adjusting a gain of a multi-stage equalizer of a serial data receiver according to the present invention.
Figure 7:
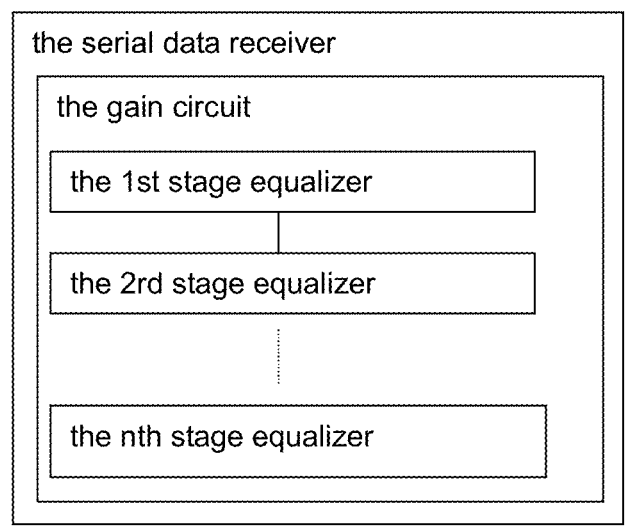
FIG. 7 is a block diagram of a serial data receiver.

Furthermore, as a preferred embodiment,
the standard gain value comprises a standard capacitance adjustment value and a standard resistance adjustment value;
as shown in FIG. 6, Step S33 further comprises:
Step S331, determining whether the gain value of the current equalization circuit is less than the standard gain value;
if yes, executing Step S332;
if no, executing Step S335;
Step S332, determining whether a capacitance value corresponding to the current equalization circuit is close to a preset capacitance maximum value;
if yes, increasing a resistance value corresponding to the current equalization circuit by a preset resistance added value, setting the capacitance value corresponding to the current equalization circuit to 0.5 times the preset capacitance maximum value, and executing Step S333;
if no, increasing the capacitance value corresponding to the current equalization circuit by a preset capacitance increasing value, and executing Step S333;
Step S333, determining whether the capacitance value corresponding to the current equalization circuit is close to the preset capacitance maximum value;
if yes, setting the capacitance value and the resistance value corresponding to the current equalization circuit to the standard capacitance adjustment value and the standard resistance adjustment value, and executing Step S4;
if no, increasing the number of cycle once, and returning to Step S332 until the number of cycle is equal to a preset number of cycle threshold value, and executing Step S334;
Step S334, determining whether the capacitance value corresponding to the current equalization circuit is close to the preset capacitance maximum value;
if yes, setting the capacitance value and the resistance value corresponding to the current equalization circuit to the standard capacitance adjustment value and the standard resistance adjustment value, and executing Step S4;
if no, returning to Step S331;
Step S335, determining whether the capacitance value corresponding to the current equalization circuit is close to a preset capacitance minimum value;
if yes, decreasing a resistance value corresponding to the current equalization circuit by a preset resistance added value, setting the capacitance value corresponding to the current equalization circuit to 0.5 times the preset capacitance maximum value;
if no, decreasing the capacitance value corresponding to the current equalization circuit by the preset capacitance added value;
Step S336, determining whether the capacitance value corresponding to the current equalization circuit is close to the preset capacitance minimum value;
if yes, setting the capacitance value and the resistance value corresponding to the current equalization circuit to the standard capacitance adjustment value and the standard resistance adjustment value, and executing Step S4;
if no, increasing the number of cycle once, and returning to Step S335 until the number of cycle is equal to a preset number of cycle threshold value, and executing Step S337;
Step S337, determining whether the capacitance value corresponding to the current equalization circuit is close to the preset capacitance minimum value;
if yes, setting the capacitance value and the resistance value corresponding to the current equalization circuit to the standard capacitance adjustment value and the standard resistance adjustment value, and executing Step S4;
if no, returning to Step S331.

Furthermore, as a preferred embodiment, the preset capacitance added value is set according to user requirements, and/or
the preset resistance added value is set according to user requirements.
Furthermore, as a preferred embodiment, a plurality of the preset capacitance added values may be set according to user requirements; and suitable preset capacitance added values may be selected as desired.
A plurality of the preset resistance added values may be set according to user requirements; and suitable preset resistance added values may be selected as desired.
Furthermore, in the above-mentioned embodiment, the preset maximum capacitance value may be set according to user requirements; and/or
the preset minimum capacitance value may be set according to user requirements.
The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:
1. A method for automatically adjusting a gain of a multi-stage equalizer of a serial data receiver, applied to the serial data receiver, wherein,
the serial data receiver comprises a gain circuit, the gain circuit comprises a multi-stage equalization circuit, and each stage of the equalization circuit is arranged in series;
the method for automatically adjusting comprises:
Step S1, setting corresponding reference numbers for each stage of the equalization circuit in sequence;
Step S2, selecting an equalization circuit corresponding to the reference numbers from the gain circuit according to a preset rule;
Step S3, sequentially adjusting the selected equalization circuit of each stage according to the sequence of the reference numbers to obtain corresponding standard adjustment values; and
Step S4, adjusting the equalization circuit greater than or equal to the corresponding reference number according to the standard adjustment values;
the equalization circuit is provided with a standard gain value;
Step S3 further comprises:
Step S31, comparing a gain value of the current equalization circuit with the standard gain value;
Step S32, setting the gain value of the current equalization circuit to the standard gain value, and executing Step S4;
Step S33, adjusting the gain value of the current equalization circuit until the gain value of the current equalization circuit is set to the standard gain value, then executing Step S4
during executing Step S31, if the gain value of the current equalization circuit is equal to the standard gain value, executing Step S32;
if the gain value of current the equalization circuit is not equal to the standard gain value, executing Step S33.
2. The method for automatically adjusting according to claim 1, wherein the preset rule in Step S2 is to select the equalization circuit corresponding to the reference number at a preset interval.

3. The method for automatically adjusting according to claim 2, wherein the preset interval is more than one of the equalization circuits.

4. The method for automatically adjusting according to claim 1, wherein the preset rule in Step S2 comprises:

Step C1, counting the number of the equalization circuits;

Step C2, calculating the reference number of the selected equalization circuit using the following formula according to the number;

$$\begin{cases} A = 1, m = 1 \\ A = \frac{2^{m-1} - 1}{2^m - 1} \times n, m \geq 2 \end{cases}$$

wherein A represents the reference number of the selected equalization circuit, when A is not an integer, A is set to an integer closest to A and greater than A;

m represents a current round of selection; and n represents the number of the equalization circuits.

5. The method for automatically adjusting according to claim 1, wherein the equalization circuit comprises two branch circuits, one end of each of the two branch circuits is connected to VDD, and the other end of each of the two branch circuits is connected to GND;

a NMOS transistor is arranged on each of the two branch circuits;

a resistor is connected between a drain of the NMOS transistor of each of the two branch circuits and VDD;

an output point is arranged between the resistor of each of the two branch circuits and the drain of the NMOS transistor, and a branch capacitor is connected between the output point and GND;

a current source is connected between a source of the NMOS transistor of each of the two branch circuits and GND;

a first access point is arranged between the source of the NMOS transistor of each of the two branch circuits and the current source, and an adjusting resistor is connected between the two first access points;

a second access point is arranged between the first access point of each of the two branch circuits and the current source, and an adjusting capacitor is connected between the two second access points; and/or the equalization circuit is provided with a transfer function expressed by the following formula:

$$H(S) = \frac{g_m}{C_p} \frac{s + \frac{1}{R_s C_s}}{\left(s + \frac{1 + g_m R_s/2}{R_s C_s}\right)\left(s + \frac{1}{R_D C_p}\right)}$$

wherein $g_m$ represents transconductance;

s represents variables of the transfer function;

$R_D$ represents resistance;

$C_p$ represents capacitances of the two branch circuits;

$R_s$ represents an adjusting resistance;

$C_s$ represents an adjusting capacitance.

6. The method for automatically adjusting according to claim 5, wherein the gain value of the current equalization circuit is calculated based on the transfer function according to the following formula;

$$IdealPeaking = \frac{Idealpeakgain}{DCgain} = 1 + g_m R_s / 2;$$

wherein Ideal Peaking represents the gain value;

Ideal peak gain represents a maximum gain value; and

DC gain represents a DC gain value.

7. The method for automatically adjusting according to claim 1, wherein the standard gain value comprises a standard capacitance adjustment value and a standard resistance adjustment value;

The Step of adjusting the gain value of the current equalization circuit until the gain value of the current equalization circuit is set to the standard gain value further comprises:

Step S331, determining whether the gain value of the current equalization circuit is less than the standard gain value;

Step S332, determining whether a capacitance value corresponding to the current equalization circuit is close to a preset capacitance maximum value;

Step S333, determining whether the capacitance value corresponding to the current equalization circuit is close to the preset capacitance maximum value;

Step S334, determining whether the capacitance value corresponding to the current equalization circuit is close to the preset capacitance maximum value;

Step S335, determining whether the capacitance value corresponding to the current equalization circuit is close to a preset capacitance minimum value;

Step S336, determining whether the capacitance value corresponding to the current equalization circuit is close to the preset capacitance minimum value;

Step S337, determining whether the capacitance value corresponding to the current equalization circuit is close to the preset capacitance minimum value;

during executing the Step S331, if yes, executing Step S332; if no, executing Step S335;

during executing the Step S332, if yes, increasing a resistance value corresponding to the current equalization circuit by a preset resistance added value, setting the capacitance value corresponding to the current equalization circuit to 0.5 times the preset capacitance maximum value, and executing Step S333;

if no, increasing the capacitance value corresponding to the current equalization circuit by a preset capacitance added value, and executing Step S333;

during executing the Step S333, if yes, setting the capacitance value and the resistance value corresponding to the current equalization circuit to the standard capacitance adjustment value and the standard resistance adjustment value, and executing Step S4;

if no, increasing the number of cycle once, and returning to the Step S332 until the number of cycle is equal to a preset number of cycle threshold value, and executing Step S334;

during executing the Step S334, if yes, setting the capacitance value and the resistance value corresponding to the current equalization circuit to the standard capacitance adjustment value and the standard resistance adjustment value, and executing Step S4;

if no, returning to Step S331;

during executing the Step S335, if yes, decreasing a resistance value corresponding to the current equalization circuit by a preset resistance added value, setting the capacitance value corresponding to the current equalization circuit to 0.5 times the preset capacitance maximum value;

if no, decreasing the capacitance value corresponding to the current equalization circuit by the preset capacitance added value;

during executing the Step S336, if yes, setting the capacitance value and the resistance value corresponding to the current equalization circuit to the standard capacitance adjustment value and the standard resistance adjustment value, and executing Step S4;

if no, increasing the number of cycle once, and returning to Step S335 until the number of cycle is equal to a preset number of cycle threshold value, and executing Step S337;

during executing the Step S337, if yes, setting the capacitance value and the resistance value corresponding to the current equalization circuit to the standard capacitance adjustment value and the standard resistance adjustment value, and executing Step S4;

if no, returning to Step S331.

8. The method for automatically adjusting according to claim 7, wherein the preset capacitance added value is set according to user requirements, and/or the preset resistance added value is set according to user requirements.

* * * * *